United States Patent
Helio et al.

(10) Patent No.: US 8,674,741 B2
(45) Date of Patent: Mar. 18, 2014

(54) DELAY CHAIN CIRCUIT

(75) Inventors: Petri Antero Helio, Tampere (FI); Jouni Tapio Kinnunen, Kangasala (FI); Niko Juhani Mikkola, Tampere (FI); Paavo Sakari Vaananen, Nokia (FI)

(73) Assignee: Nokia Corporation, Espoo (FI)

( * ) Notice: Subject to any disclaimer, the term of this patent is extended or adjusted under 35 U.S.C. 154(b) by 729 days.

(21) Appl. No.: 12/810,544

(22) PCT Filed: Dec. 19, 2008

(86) PCT No.: PCT/EP2008/068018
§ 371 (c)(1),
(2), (4) Date: Aug. 16, 2010

(87) PCT Pub. No.: WO2009/083496
PCT Pub. Date: Jul. 9, 2009

(65) Prior Publication Data
US 2010/0308871 A1    Dec. 9, 2010

(30) Foreign Application Priority Data
Dec. 28, 2007  (GB) .................................. 0725317.2

(51) Int. Cl.
*H03H 11/26*    (2006.01)
(52) U.S. Cl.
USPC ........................................................ 327/269

(58) Field of Classification Search
USPC .......................................................... 327/269
See application file for complete search history.

(56) References Cited

U.S. PATENT DOCUMENTS

| | | | |
|---|---|---|---|
| 5,703,838 A | 12/1997 | Gorbics et al. | |
| 6,366,149 B1 * | 4/2002 | Lee et al. | 327/276 |
| 2003/0006750 A1 | 1/2003 | Roberts et al. | |
| 2005/0035799 A1 | 2/2005 | Mikhalev et al. | |
| 2007/0085570 A1 | 4/2007 | Matsuta | |

FOREIGN PATENT DOCUMENTS

WO    WO 2007/120670 A2    10/2007

OTHER PUBLICATIONS

Galton, I., "Analog-Input Digital Phase-Locked Loops for Precise Frequency and Phase Demodulation", IEEE Transactions on Circuits and Systems—II: Analog and digital Signal Processing, vol. 42, No. 10, Oct. 1995, pp. 621-630.

* cited by examiner

*Primary Examiner* — Daniel Rojas
(74) *Attorney, Agent, or Firm* — Harrington & Smith (57) ABSTRACT

A delay chain circuit including at least two delay elements, wherein each delay element is configured to: receive a first signal; output a second signal after a delay period; and be operable in at least two modes of operation wherein in a first mode of operation each delay element has a first delay period and in a second mode of operation each delay element has a second delay period.

18 Claims, 5 Drawing Sheets

DELAY CHAIN CIRCUIT

FIELD OF THE INVENTION

The present invention is related to delay chain circuitry, and more particularly but not exclusively a multiple mode delay circuit for time to digital conversion analysis in a digitally controlled oscillator.

BACKGROUND

One of the key building blocks found in most electronic equipment is the frequency synthesizer. The frequency synthesizer outputs an oscillator output which may be used for signal generation or signal mixing.

Signal mixing may be used for example in a receiver to down convert a received radio frequency signal to a baseband frequency signal in order that the modulating/information signal, in the received signal may be separated from the carrier signal. Similarly signal mixing may be used in a transmitter to up convert the information/modulating signal to the carrier frequency.

In a transmitter the modulating signal is formed in the base band frequency (i.e. around zero frequency). For example a phase of certain selected pulse form is modulated depending on the information that is to be transmitted. In a communication system using a radio channel to transmit the information, the base band signal is then up-converted to a radio frequency of the radio channel by mixing it with a local oscillator (LO) signal. In a direct conversion transmitter the mixing is carried out in one stage and the base band signal is therefore multiplied with a local oscillator signal which has a frequency determined by the radio channel used in that particular communication system. In a frequency domain representation this can be described as the base band signal being transferred from a zero frequency to the local oscillator frequency which in the case of the direct conversion transmitter is in the middle of the transmitted channel.

In a receiver the local oscillator is used to convert the received signal down in frequency from the received signal radio frequency to the base band (zero frequency) or intermediate frequency. In case of a direct conversion receiver the received signal is mixed to the zero frequency in a single stage. In this way the carrier component (i.e. the frequency component in the LO frequency band) of the received signal is removed and the synchronization to the modulated base band signal is possible Frequency synthesizers have traditionally been created using crystal oscillators, phase locked loops (PLL) consisting of voltage controlled oscillators (VCO) and digitally controlled oscillators (DCO).

Digitally controlled oscillators (DCO) can be used in digital phase locked loops to create a controllable and tuneable frequency synthesizer such as the one featured in Golten's paper "Analog-Input Digital Phase Locked Loops for Precise Frequency and Phase Modulation", IEEE transactions on Circuits and Systems—II; Analog and Digital Signal Processing, Volume 42, No 10, October 1995. This implementation shows where the conventional analogue phase locked loop circuit can be at least partially digitized by replacing the analogue loop filter with a discrete-time loop filter, the phase detector by a sampled phase detector, and the voltage control oscillator by a digitally controlled oscillator (DCO).

Implementations of the digital phase locked loops typically feature a time to digital converter (TDL) component which compares the timing of the input reference clock with the DCO output. The time to digital converter (TDC) can be for example a Vernier Delay Line (VDL). The Vernier delay line is an array of cells or stages, each stage receives the digitally controlled oscillator and reference signal output from a previous stage, delaying each input by a predefined delay period, detecting if there is a timing delay between the signals and outputting the delayed signal to the next stage.

The VDL implementations currently in use have problems in that a single VDL configuration can either provide high accuracy or short delay path but not both. For example if each delay element is designed to produce a delay resolution of 1 ps, then in order to cover a range of 500 ps 500 delay elements are required.

By creating a VDL implementation with this number of cells the VDL implementation requires a significant amount of silicon area on the integrated circuit. Also in order to drive the delay and comparison circuits in the long chain cell device requires a significant amount of current. This current thus results in high power consumption and requires extra cooling to dissipate the extra heat of such a circuit. Furthermore the implementation of long delay line may become difficult, due to high precision and matching requirements.

There have been some previous attempts to improve this problem. In U.S. Pat. No. 5,703,838, a Vernier delay line is provided with an interpolator which provides a precision level smaller than a clock period. It does so by delaying a periodic pulse signal on a delay line which has equal time spaced taps and with a total delay which has a harmonic greater than 1 pulse period.

However making equally spaced taps on input signal harmonics is challenging and requires for example a small PLL circuit (inside a PLL system) to be accurate.

US-20030006750 describes a single stage VDL structure used to mimic the behaviour of a chain of VDL stages. However, such an implementation cannot effectively operate in high resolution time digitalisation situations because it is impossible to implement the counter for very small delay feedback oscillators.

SUMMARY OF THE INVENTION

It is an object of the present invention to provide a time to digital converter which overcomes the disadvantages of the prior art, or at least provides a useful alternative.

According to a first aspect of the present invention there is provided a delay chain circuit comprising at least two delay elements, wherein each delay element is configured to: receive a first signal; output a second signal after a delay period; and be operable in at least two modes of operation wherein in a first mode of operation each delay element has a first delay period and in a second mode of operation each delay element has a second delay period.

Each delay element may comprise a mode selection switch configured to switch the mode of operation of the delay element dependent on the signal input to the mode selection switch.

Each delay element may comprise an inverter circuit, wherein the second signal is an inverted first signal.

Each inverter circuit may comprise at least one clocked input, wherein the inverter circuit is configured to output the second signal on receiving a clock signal on the at least one clocked input.

The mode selection switch is preferably configured to enable or bypass each of the at least one clocked inputs.

The inverter circuit has preferably the first delay period when at least one of the at least one clocked inputs is bypassed.

The first delay period is preferably shorter than the second delay period.

According to a second aspect of the present invention there is provided a method for operating a delay chain circuit comprising at least two delay elements, wherein for each delay element the method comprises: receiving a first signal; and outputting a second signal after a delay period, wherein each delay element is operable in at least two modes of operation, in a first mode of operation each delay element has a first delay period and in a second mode of operation each delay element has a second delay period.

The method may further comprise operating the mode of operation of the delay element dependent on a signal input.

The method may further comprise generating the second signal by inverting the first signal.

The method may further comprise delaying the outputting of the second signal until receiving a clock signal on the at least one clocked input.

The method may further comprise outputting the second signal when receiving the inverted first signal.

The method may further comprise outputting the second signal after the first delay period.

The first delay period is preferably shorter than the second delay period.

An apparatus may comprise a delay chain circuit as featured above.

A frequency synthesizer may comprise a delay chain circuit as featured above.

A chipset may comprise a delay chain circuit as featured above.

An electronic device may comprise a delay chain circuit as featured above. According to a third aspect of the present invention there is provided a computer program product configured to perform a method for operating a delay chain circuit comprising at least two delay elements, wherein for each delay element the method comprises: receiving a first signal; and outputting a second signal after a delay period, wherein each delay element is operable in at least two modes of operation, in a first mode of operation each delay element has a first delay period and in a second mode of operation each delay element has a second delay period.

According to a fourth aspect of the invention there is provided a delay chain circuit comprising at least two delay elements, wherein each delay element comprises means for receiving a first signal; means for outputting a second signal after a delay period; and control means for operating the delay element in at least two modes of operation wherein in a first mode of operation each delay element has a first delay period and in a second mode of operation each delay element has a second delay period.

The circuit as described above may be incorporated into a mixer.

The circuit as described above may be incorporated into a transmitter.

The circuit as described above may be incorporated into a receiver.

The circuit as described above may be incorporated into a user equipment.

The circuit as described above may be incorporated into a base station.

BRIEF DESCRIPTION OF THE DRAWINGS

Embodiments of the invention will now be described, by way of example only, with reference to the accompanying drawings in which.

DETAILED DESCRIPTION OF PREFERRED EMBODIMENTS

Figure 1:
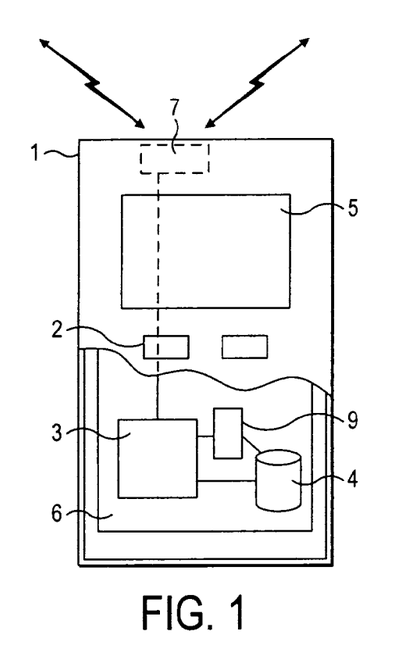
FIG. 1 shows a schematic diagram of an electronic device capable of implementing embodiments of the invention.

FIG. 1 shows a schematic partially sectioned view of a possible electronic device capable of implementing embodiments of the invention. The electronic device may be a user equipment as shown in FIG. 1 used for various tasks such as making and receiving phone calls, for receiving and sending data to and from a data network and for receiving and transmitting the data in the form of multimedia content. Although an electronic device is shown in the form of user equipment and specifically the implementation of the oscillator for communication purposes embodiments of the invention may be implemented in any electronic device requiring a stable but tuneable oscillator.

An appropriate electronic device may be any device capable of sending or receiving radio signals. Non-limiting examples include mobile stations (MS), user equipment (UE), portable computer equipment provided with a wireless interface card or other wireless interface facility, personal data assistants (PDA) provided with wireless communication capabilities, or any combinations of these or the like.

The electronic device may communicate via an appropriate radio interface arrangement of the mobile device. The interface arrangement may be provided by means of a radio frequency and associated antenna arrangement 7. The antenna arrangement may be arranged internally or externally to the electronic device. The radio part may comprise at least one mixer configured to down-convert or up-convert signals to and from the mobile station. The mixer device may comprise a tuneable frequency synthesiser according to the embodiments of the invention. The term frequency synthesiser may also be known as a frequency oscillator. The frequency synthesiser/frequency oscillator may be capable of supplying an oscillation signal of various predetermined or defined frequencies.

The electronic device is typically provided with at least one data processor 3 and at least one memory 4 for storing data and instructions used by the data processor 3. The data processor 3 and memory 4 may be provided on an appropriate circuit board and/or in chip sets 6.

The user may control the operation of the electronic device by means of a suitable user interface such as a keypad 2, voice command, touch-sensitive screen or pad, or a combination thereof or the like. A display 5, a speaker and a microphone are also typically provided. Furthermore, an electronic device may comprise appropriate connectors (either wired or wireless) to other electronic devices and/or for connecting external accessories, for example hands-free equipment, thereto.

The remainder of the parts of the electronic device are known generally and do not assist in the understanding of the invention and will not be described in further detail hereafter.

Figure 2:
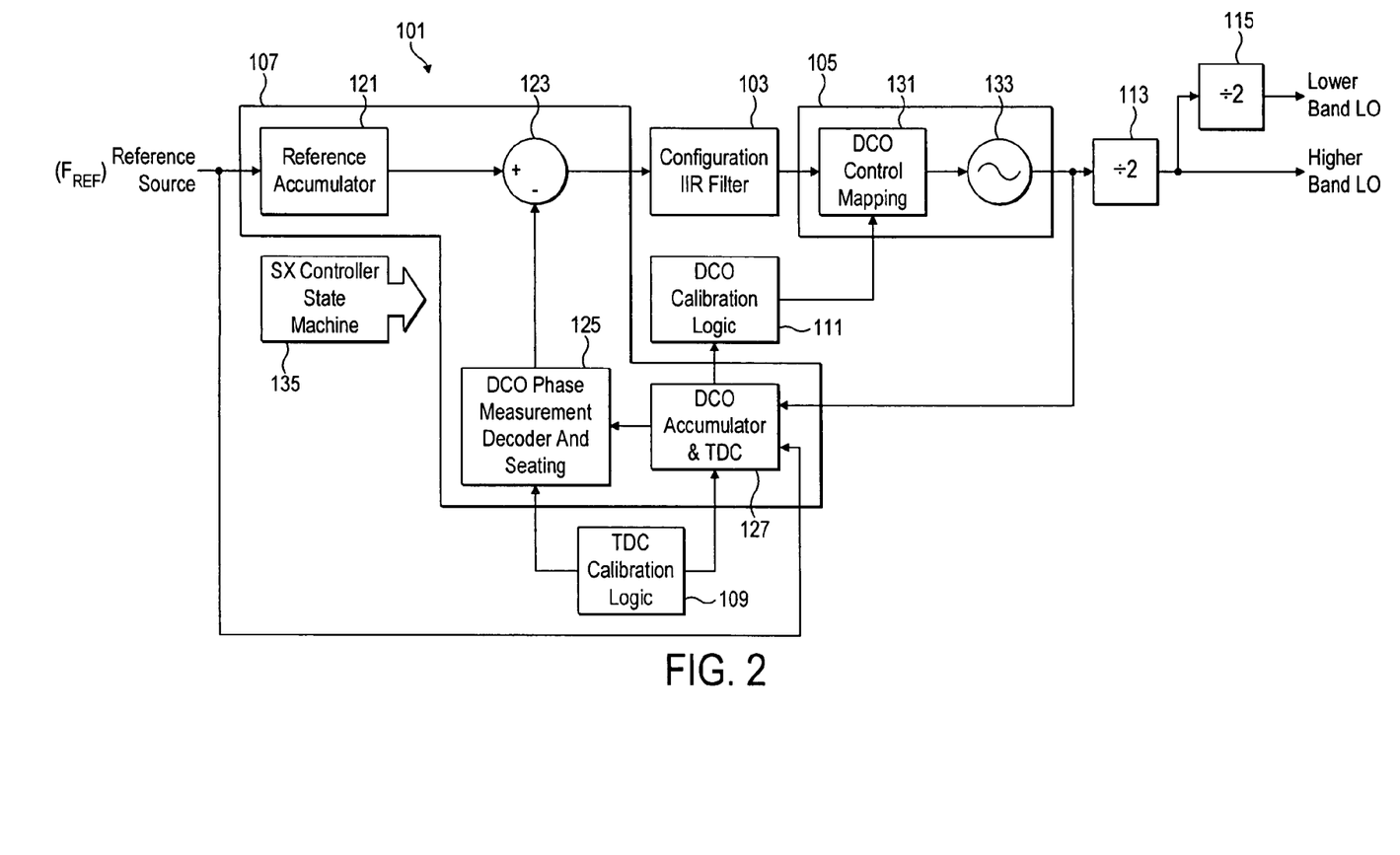
FIG. 2 shows a schematic diagram of a digital synthesiser capable of implementing embodiments of the invention and being implemented within the user equipment of FIG. 1.

FIG. 2 shows a schematic view of a frequency synthesiser as implemented within the radio part 7 of FIG. 1.

The frequency synthesiser 101 may be considered to comprise a series of interconnected functional blocks.

The discrete-time loop filter (which may be a configurable infinite impulse response filter) 103 receives a detected phase difference signal from a phase detector 107 and outputs a filtered phase difference to the digitally controlled oscillator 105. The digitally controlled oscillator then feeds back the DCO output to the phase detector 107 which compares the phase of the DCO output with the reference frequency output to output a detected phase difference signal.

The discrete-time loop filter 103 may be configured to produce a zero-pole pair for the loop transfer function in order to stabilise the loop. The discrete-time loop filter 103 may be configured so that the location of the zero and the pole may be adjustable in order to optimise the in-band noise for a certain system or to tune the filter during the settling sequence in such a manner that the settling period is shorter.

The digitally controlled oscillator (DCO) 105 receives the input from the discrete-time loop filter 103 (configurable infinite impulse response filter) and outputs the digitally controlled oscillator output to the phase detector 107.

The discrete controlled oscillator block 105 comprises a discrete controlled oscillator control mapping block 131 and a digitally controlled oscillator 131.

The discrete controlled oscillator control mapping block 131 receives outputs from the configurable infinite impulse response filter 103 and discrete controlled oscillator (DCO) calibration logic 111. The DCO control mapping block 131 comprises a series of mappings by which input signals are mapped to produce a control output for the digitally controlled oscillator 133. The digitally controlled oscillator control mapping block 131 in practice has several parallel control matrices to produce the mapping function.

The DCO calibration logic block 111 receives the output of the DCO accumulator and determines if there has been any potential drift of the digitally controlled oscillator tuning characteristics due to IC processing variations and environmentally variations and provides a trimming or adjustment signal to the DCO control mapping to assist in the prevention in any change of the output frequency due to environmental conditions or construction changes The phase detector (PD) 107 receives the reference source input $F_{ref}$ and the output of the digitally controlled oscillator 105 and outputs a detected phase signal to the discrete time loop filter 103.

The control state machine 135 controls the operation of the frequency synthesizer 101 so that there may be a separate phase-locked loop settling state and a locked-in state.

The phase detector 107 comprises a reference accumulator 121, a discrete time-domain integrator which receives the reference source input signal ($F_{REF}$) and outputs values which increase by an amount defined by the synthesiser channel control for every reference source input signal cycle.

The output of the reference accumulator 121 is connected to a summing device 123. The summing device 123 also receives an output from the digitally controlled oscillator phase measurement decoder and scaler 125 and outputs the difference value between the output of the reference accumulator 121 and the output of the digitally controlled oscillator phase measurement decoder and scaler 125. This difference value is output to the discrete-time loop filter 103.

The phase detector 107 furthermore comprises a digitally controlled oscillator (DCO) accumulator and time-to-digital converter (TDC) 127. The DCO accumulator may be a discrete time integrator which receives an input from the output of the digitally controlled oscillator 105 and produces an output which is read for every reference source input signal cycle.

The operation of the TDC is described with reference to FIGS. 3 to 6 below.

The DCO accumulator and TDC 127 output a result value to the DCO calibration logic 111. The DCO accumulator and TDC 127 furthermore output a TDC result value to the TDC calibration logic 109. The DCO accumulator and TDC 127 also output a DCO accumulator result value and the TDC result value to the DCO phase measurement decoder and scaler 125.

The DCO phase measurement decoder and scaler 125 receives the DCO accumulator result value and the TDC result value and samples these values for each reference source input signal cycle.

The scaler produces a scaling of TDC result value according to the desired frequency (which in transceivers is dependent on the transceiver channel). In other words the TDC result value is normalized by the scaler to produce a TDC result value which is normalized to the full cycle of the desired digitally controlled oscillator (DCO) period. The scaled TDC result and DCO accumulator result values are passed to the summing device for comparison with the reference source input signal as described previously above.

The TDC calibration logic 109 receives the output from the DCO Accumulator and TDC unit 127 and outputs to the DCO phase measurement decoder and scaling block 125. The TDC calibration logic block 109 maintains a control of the DCO phase measurement decoder and scaler 125 such that the TDC signal is kept within certain limits. For example, the TDC calibration logic block 109 tracks the changes in the measurement resolution due to environmental changes and compensates for effects in both environmental changes and IC production variations to prevent these limits being exceeded.

Figure 3:
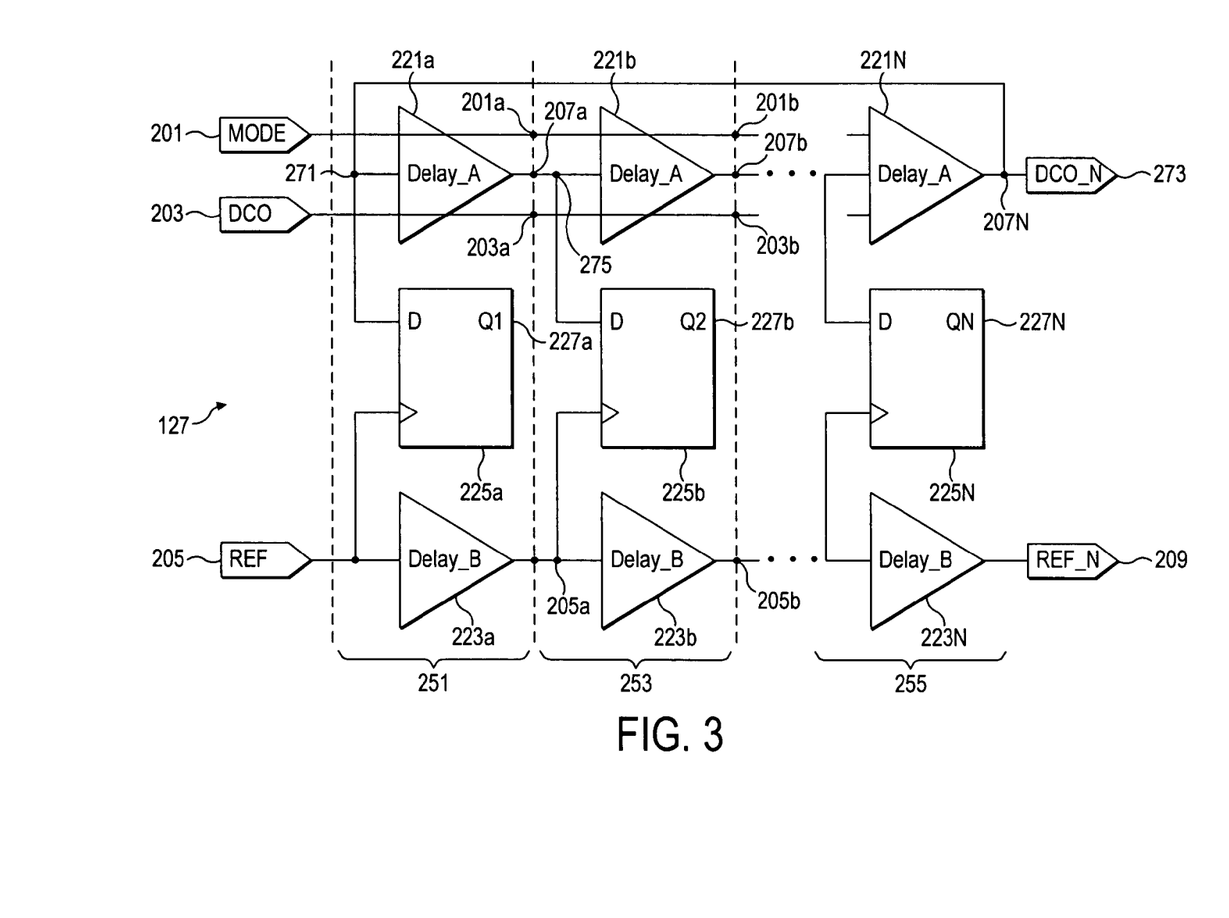
FIG. 3 shows a schematic diagram of a dual mode TDC architecture as capable of being implemented within a frequency synthesiser as shown in FIG. 2.

With respect to FIG. 3 a dual mode time to digital (TDC) converter architecture is shown incorporating embodiments of the present invention. The time to digital converter 127 comprises a series of stages. The embodiment shown in FIG. 3 shows three stages of a N stage arrangement. In other embodiments of the invention any number of stages may be used.

Each stage comprises a delay element 251, a latch 225 and a dual mode delay element 221.

The delay element 251 receives a reference frequency signal from an output of a previous stage delay element and outputs a delayed version of the received reference frequency signal to a succeeding stage delay element.

The dual mode delay element 221 receives a loop DCO signal from an output of a previous stage dual mode delay element and outputs a delayed version of the loop DCO signal to a succeeding stage dual mode delay element. Furthermore each dual mode delay element receives a DCO signal input as a clocking input and a mode select signal input.

The latch receives the DCO loop signal and reference frequency signal from the previous stage dual mode delay element and delay element respectively. The loop DCO signal is input to the data input of the latch and the reference frequency signal is input to the clock input of the latch. Thus at the point of the received reference frequency signal activating the latch the latch outputs the value of the received loop DCO signal.

For example the first stage 251 delay element 223a receives the reference frequency input 205 and outputs a delayed reference frequency signal to the second stage reference frequency input 205a.

The first stage 251 latch 225a receives as a clocking input the reference frequency signal 205 and receives a DCO loop signal from the DCO loop signal input 271 as the data input signal. The latch outputs a detection signal 227a.

The first stage 251 dual mode delay element 221a receives the mode selection signal 201, the DCO signal input 203 and a loop DCO signal 271 provided by the output of the final stage 221n dual mode delay element 221n loop DCO output 207n.

The first stage 251 dual mode delay element 221a delay element delays the loop DCO signal to output a delayed version of the signal 207a which is used as the input to the second stage 253 dual mode delay element 221a loop DCO input 207n and as the data input for the second stage latch data input.

The final stage 255 dual mode delay element 221n has a mode selection signal 201 input, a loop DCO input from the output of a preceding stage loop DCO output, and the DCO input 203. The dual mode delay element 221n outputs a loop DCO signal 207n which is fed back to the first stage 251 to be used as the input to the first stage 251 dual mode delay element 221a loop DCO signal input 271 and the loop DCO output signal (DCO_N)273.

The final stage 255 latch 225n receives the loop DCO signal from the output of a preceding stage loop DCO output as a data input, and the delayed reference frequency signal from a preceding stage reference frequency output and outputs a detection signal QN 227n.

The delay element 223n receives the delayed reference signal from a preceding stage reference frequency output and outputs a delayed reference signal REF_n 209.

Figure 4:
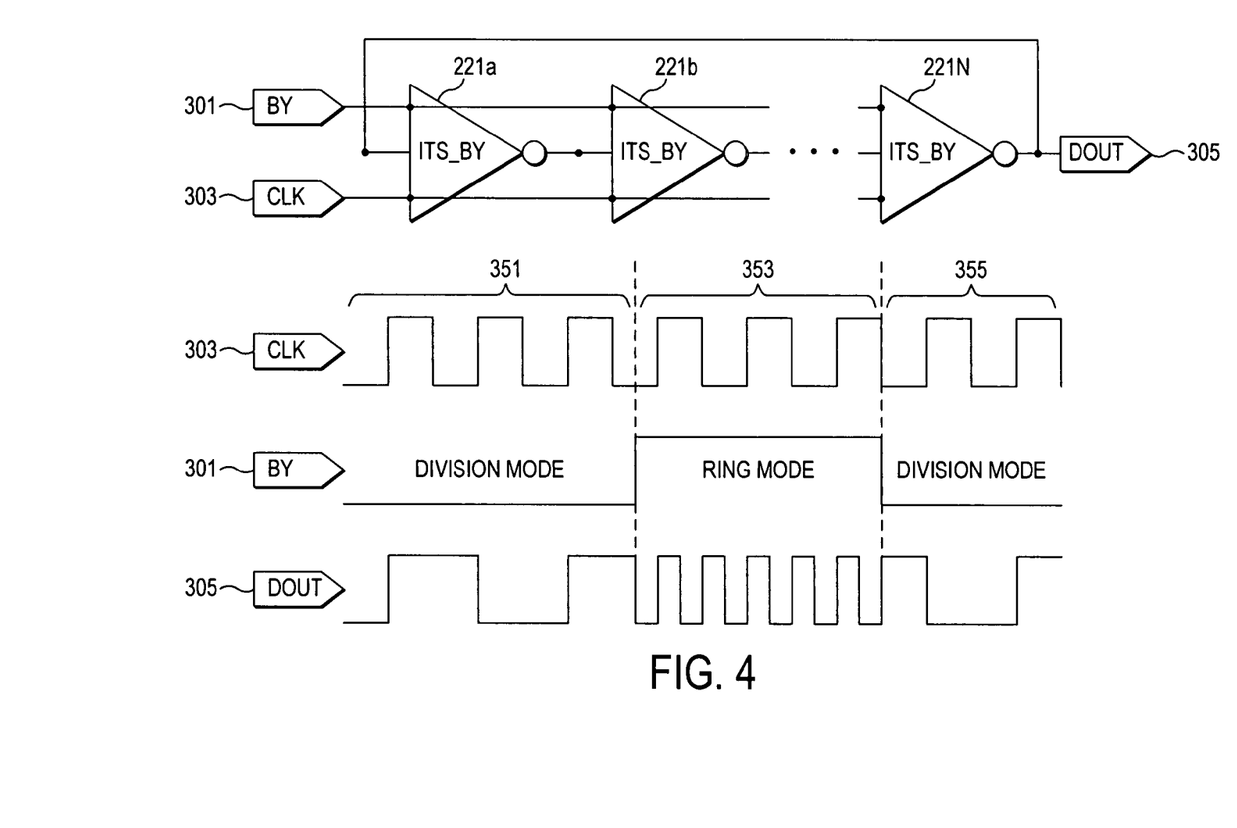
FIG. 4 shows a schematic diagram of a dual mode delay cell chain as implemented in embodiments of the invention.

With respect to FIG. 4, the chain of dual mode delay elements is shown and demonstrates the two modes within which the delay elements may be operated and thus the two modes within which the TDL may be operated.

The arrangement of the chain of dual mode delay elements 221a, 221b, 221n is largely the same as previously described with respect to FIG. 3. Each of the three delay elements 221a, 221b, 221n receive a mode (or bypass BY) signal 301 and a DCO (or clock CLK) signal 303. Furthermore each dual mode delay element 221a, 221b and 221n receives a loop DCO (loop clock) signal from a preceding dual mode delay element.

FIG. 4 furthermore shows a graph of the effect of switching between the two modes of operation. These two modes are called the ring mode and division mode. The first row of signals show the oscillation of the clock signal 303 over a time period. The second row of signals show the bypass signal 301 which selects which mode of operation the chain of elements operate in. The third row of signals show the output at the final stage loop DCO signal 305.

The chain operates in such a manner that when the bypass (or mode selection) signal is low the chain/delay element operates in a 'division mode'. In the division mode of operation the delay implemented by any one element of the delay element is the clock frequency and thus the total delay or oscillation period is determined by the clock period multiplied by the number of stages—in other words the output frequency of the loop DCO signal is the clock frequency divided by the number of stages.

This can be seen in the division mode parts 351 and 355 of FIG. 4 where the DCO output signal is ½ the frequency of the clock signal (in this case the number of stages in the delay chain is 2).

When the bypass signal is high the chain/delay element operates in a second mode of operation, known as the ring mode. In this mode of operation the clock input is bypassed in the delay element and the signal is delayed determined only by the delay time of the circuitry alone.

Figure 5:
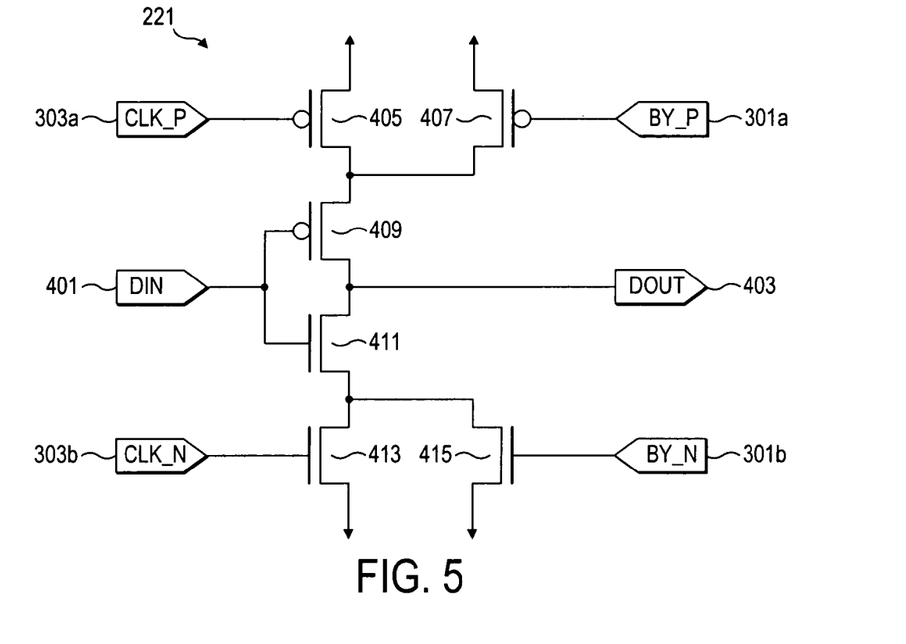
FIG. 5 shows a schematic diagram of a dual mode delay cell as shown in FIG. 3 and FIG. 4.

As will be shown with regards to FIG. 5 each delay element may have an internal delay which has a period much shorter than a clock value. This produces a chain loop DCO oscillation which has a much shorter period than the division mode loop DCO oscillation and thus a higher frequency DCO loop output signal 305. This can be seen in the ring mode part 353 of the third row of FIG. 4.

Thus with respect to the VDL implementation as shown in FIG. 3, it is possible to build a time to digital converter with two different resolution modes.

Using the first mode of operation of the delay cell/chain, the division mode, the dual mode delay elements are clocked with a digitally controlled oscillator signal. This enables resolution to be achieved by triggering the loop DCO signal with latches clocked with the reference signal. In this mode of operation a 1 GHz DCO signal clocked produces a timing resolution of 1000 ps (or 500 ps if a half period is used) by clocking the digitally controlled oscillator signal with the reference signal.

This mode of operation can therefore be used for coarse timing estimation to provide a rough timing output value.

The reference signal is continuously providing a clock for the DCO-path delay chain (which is shown by the upper delay path in FIG. 3). The clocking is done by using the latches shown in the middle of FIG. 3. The latches store (or clock) the state of the DCO path input, which is in the DCO-path delay chain. The DCO-path delay chain state may be either free running (ring mode), or defined by a DCO clock (division mode). Snapshots of this state are therefore stored by using the REF-signal and the latches.

Using the second mode of operation of the delay cell/chain, the ring mode, the VDL effectively becomes an infinite delay chain. In this mode of operation the latches with an input provided by the loop DCO signal clocked by the reference signal provides a good resolution relative to long VDL chains but using only a limited number of delay elements.

Furthermore by switching between the two modes of operation it is possible to produce a time to digital converter which is capable of operation over a wide range of operation but with a sufficiently good resolution and using a small number of delay stages.

Figure 6:
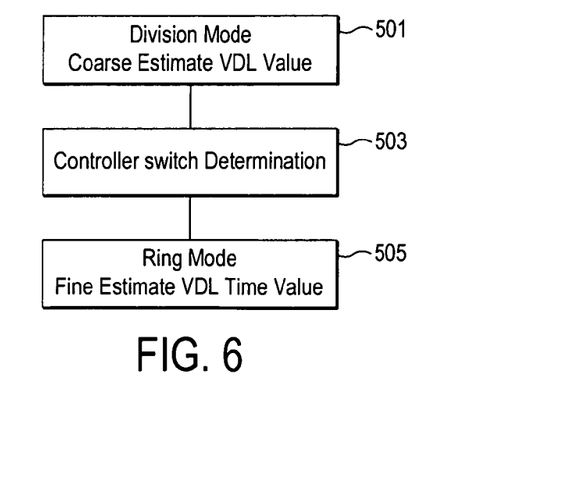
FIG. 6 shows a flow diagram illustrating the operation of the dual mode cell implementation.

With respect to FIG. 6 this operation may be shown. In the first operation an initial coarse estimation is possible with the division mode of operation. This coarse estimation is shown in step 501 of FIG. 6.

Knowing the coarse estimate a VDL controller then on performing a further operation of the VDL switches the VDL as shown in FIG. 3 from division to ring mode of operation as close to but before the estimated time value. This near coarse estimate switch is shown in step 503 of FIG. 6.

The VDL then uses the high resolution ring mode of oscillation to produce a more accurate estimate of the timing difference than could be achieved with the clocked 'division mode' of operation VDL alone. This fine estimation is shown in step 505 of FIG. 6.

In further embodiments of the invention, it is possible to design the circuitry such that the reference signal path is configured to have delays equivalent to multiple periods of the digitally controlled oscillator delay element. In such circumstances, the averaging is done over a pre-determined time period defined by the multiple periods.

With respect to FIG. 5, a single dual mode delay element is shown as may be implemented in embodiments of the invention. The dual mode delay element 221 receives a positive clock signal (CLK_p) 303a, a negative clock signal (CLK_n) 303b, a bypass/mode selection positive signal 301a, a bypass/ mode selection negative signal 301b, a data in DIN 401 and data out DOUT 403 connections.

The dual mode element comprises a inverter circuit comprising a pair of transistors. The pair of transistors 409 and 411 are arranged so that the first transistor, a PMOS transistor, 409 has a base connected to the data in, a drain connected to the data out. The second transistor, a NMOS transistor, 411 is configured to have a base connected to the base of the first transistor 409 and a source connected to the drain of the first transistor 409.

The dual mode delay element 221 furthermore comprises a third transistor, a further PMOS transistor, 405 with a base connected to the positive clock (CLK_p) signal 303, a source connected to the power supply rail, and the drain connected to the source of the first transistor 409.

The dual mode delay element 221 furthermore comprises a fourth transistor, a PMOS transistor, 407 with a base connected to the bypass/mode selection position input 301a, a source connected to the positive supply rail and the drain connected to the source of the first transistor 409.

The dual mode delay element 221 further comprises a fifth transistor, a NMOS transistor, 413. The fifth transistor 413 has a base connected to the clock negative signal (CLK_n) 303b, a drain is connected to the negative supply rail, and a source connected to the drain of the second transistor 411.

The dual mode delay element 221 further comprises a sixth transistor, a further NMOS transistor, 415. The sixth transistor 415 has a base connected to the bypass/mode selection negative input 301b, a source connected to the drain of the second transistor 411, and a drain connected to the negative supply rail.

Thus, when the bypass signal is selected in other words the bypass negative signal 301b is high and the bypass positive signal is low 301a, the fourth transistor 407 and the sixth transistor 415 are in an active state and the inverter part of the circuit is activated. Thus any data input to the DIN is inverted and output at the DOUT 403 with a delay for the device determined by the delay from the input to the output of the inverter.

When the bypass signal/mode selection signal is low, in other words that the bypass positive signal is high and the bypass negative signal is low, the bypass transistors (the fourth transistor 407 and sixth transistor 415) are switched off and the inverter function is only active when the clock signal activates the clock transistors (the third transistor 405 and fifth transistor 413). In other words when CLK_N is high and CLK_P is low the inverter is active.

Thus, the clock (CLK) operation with the terminal CLK_p and CLK_n provides a divided, in other words, clock output DOUT from the input data DIN which produces a resolution equal to the CLK input signal period. However, by setting the signal BY active, the clock is bypassed and the cell inverts directly from the input data (DIN) into output terminal DOUT after a predetermined processing delay.

It would be understood that the dual mode delay element can be used for other purposes than simply used in a time to digital converters. In particular, the circuit for example shown in FIG. 5, enables the reduction of a number of blocks in a frequency synthesizer.

A single chain of dual mode delay elements 201 may be configured in such a way that they may be used to replace both signal division and signal generation circuitry.

For example, the dual mode delay element chain may be used to produce a fractional signal division by switching from a clock mode into a ring mode. The output would be a combination of the two mode periodicities.

For example, if the clock signal mode operated with a divide by 10 division ratio for most of the time but switched to generate a few high speed transitions in the bypass mode, the average output frequency would be greater than the divide by 10 division of the purely clocked signal. This could then used to generate fractional division versions of the digitally controlled oscillator.

Thus by combining fractional signal division and generation blocks such a design enables the reduction of silicon area.

In further embodiments of the invention the delay element circuit may be operated in further modes of operation. For example a hybrid mode of operation may be implemented which is capable of producing a periodicity between that of the ring mode and division modes by switching a proportion of the stages in ring mode and a proportion of the stages in division mode. In these embodiments of the invention each of the stages may have a separate mode selection controller. In other embodiments of the invention the stages are mode switched within a time delay estimation cycle.

For example a first number of stages may be operated in division mode and the remainder may be operated in ring mode so that the time difference is detected within a single range of delay elements. In such an embodiment a VDL controller determines a coarse estimation and then switches the remainder of the elements to ring mode so that a fine estimate using the remainder of the delay elements is achieved.

Other selections for different arrangements of modes for stages are possible according to the need of the user as would be understood by the person skilled in the art.

User equipment may comprise an apparatus such as those described in embodiments of the invention above.

It shall be appreciated that the term user equipment is intended to cover any suitable type of wireless user equipment, such as mobile telephones, portable data processing devices or portable web browsers.

Furthermore elements of a public land mobile network (PLMN) may also comprise apparatus as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

For example the embodiments of the invention may be implemented as a chipset, in other words a series of integrated circuits communicating among each other. The chipset may comprise microprocessors arranged to run code, application specific integrated circuits (ASICs), or programmable digital signal processors for performing the operations described above.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A delay chain circuit comprising at least three serially connected delay elements, wherein each delay element comprises an inverter circuit and is configured to:
   receive a first signal;
   output a second signal after a delay period, the second signal being an inverted first signal; and
   be operable in at least two modes of operation wherein in a first mode of operation each delay element exhibits a first delay period based on a clock signal input to the delay element and in a second mode of operation each delay element exhibits a second delay period based on an internal delay period of the delay element.

2. The delay chain circuit as claimed in claim 1, wherein each delay element is configured to switch the mode of operation of the delay element based on a signal input to the mode selection switch.

3. The delay chain circuit as claimed in claim 1, wherein each inverter circuit comprises at least one clocked input, and wherein each inverter circuit is configured to output the second signal on receiving a clock signal on the at least one clocked input.

4. The delay chain circuit as claimed in claim 3, wherein, for each of the delay elements, switching between modes of operation comprises enabling or bypassing each of the at least one clocked inputs.

5. The delay chain circuit as claimed in claim 4, wherein, for each of the delay elements, the inverter circuit exhibits the first delay period when at least one of the at least one clocked inputs is bypassed.

6. The delay chain circuit as claimed in claim 1, wherein, for each of the delay elements, the first delay period is shorter than the second delay period.

7. An apparatus comprising a delay chain circuit as claimed in claim 1.

8. A frequency synthesizer comprising a delay chain circuit as claimed in claim 1.

9. A chipset comprising a delay chain circuit as claimed in claim 1.

10. An electronic device comprising a delay chain circuit as claimed in claim 1.

11. A method comprising:
   receiving, at each of at least three serially connected delay elements, a first signal; and
   at each of the three serially connected delay elements, generating a second signal by inverting the first signal and outputting the second signal after a delay period, wherein each delay element is operable in at least a first mode of operation exhibiting a first delay period based on a clock signal input to the delay element and in a second mode of operation exhibiting a second delay period based on an internal delay period of the delay element.

12. The method as claimed in claim 11, wherein the mode of operation of each delay element is selected based on a signal input.

13. The method as claimed in claim 11, further comprising, for each of the delay elements, delaying the outputting of the second signal until receiving a clock signal on the at least one clocked input.

14. The method as claimed in claim 11, further comprising, for each of the delay elements, outputting the second signal when receiving the inverted first signal.

15. The method as claimed in claim 14, further comprising, for each of the delay elements, outputting the second signal after the first delay period.

16. The method as claimed in claim 11, wherein, for each of the delay elements, the first delay period is shorter than the second delay period.

17. A computer readable medium storing a program of instructions, execution of which by a processor configures an apparatus to at least:
   receive a first signal at each of three serially connected delay elements; and
   after a delay period, output a second signal from each of the delay elements, the second signal being an inverted first signal, wherein each delay element is operable in at least two modes of operation, in a first mode of operation each delay element exhibits a first delay period based on a clock signal input to the delay element and in a second mode of operation each delay element exhibits a second delay period based on an internal delay period of the delay element.

18. A delay chain circuit comprising at least three serially connected delay elements, wherein each delay element comprises:
   means for receiving a first signal;
   means for generating a second signal by inverting the first signal;
   means for outputting a second signal after a delay period; and control means for operating the delay element in at least two modes of operation wherein in a first mode of operation each delay element exhibits a first delay period based on a clock signal input to the delay element and in a second mode of operation each delay element exhibits a second delay period based on an internal delay period of the delay element.

* * * * *